United States Patent
Fuechsel et al.

(10) Patent No.: US 8,217,483 B2
(45) Date of Patent: Jul. 10, 2012

(54) PHOTOSENSITIVE SEMICONDUCTOR COMPONENT

(75) Inventors: Kevin Fuechsel, Jena (DE); Andreas Tuennermann, Weimar (DE); Ernst-Bernhard Kley, Jena (DE)

(73) Assignee: Fraunhofer-Gesellschaft zur Foerderung der Angewandten Forschung E. V., Munich (DE)

( * ) Notice: Subject to any disclaimer, the term of this patent is extended or adjusted under 35 U.S.C. 154(b) by 99 days.

(21) Appl. No.: 12/624,632

(22) Filed: Nov. 24, 2009

(65) Prior Publication Data

US 2010/0133639 A1 Jun. 3, 2010

Related U.S. Application Data

(63) Continuation of application No. PCT/DE2008/000870, filed on May 21, 2008.

(30) Foreign Application Priority Data

May 25, 2007 (DE) .................. 10 2007 024 478

(51) Int. Cl.
*H01L 31/102* (2006.01)
(52) U.S. Cl. .................. 257/458; 257/E31.039
(58) Field of Classification Search .................. 257/458, 257/E32.039
See application file for complete search history.

(56) References Cited

U.S. PATENT DOCUMENTS

| | | | |
|---|---|---|---|
| 4,166,880 A | 9/1979 | Loferski et al. | |
| 4,177,093 A | 12/1979 | Feng et al. | |
| 5,949,123 A | 9/1999 | Le et al. | |
| 6,329,296 B1 | 12/2001 | Ruby et al. | |
| 7,128,975 B2 * | 10/2006 | Inomata | 428/446 |
| 2003/0099897 A1 * | 5/2003 | Fedynyshyn | 430/192 |
| 2006/0008580 A1 * | 1/2006 | Nelles et al. | 427/162 |
| 2006/0225775 A1 * | 10/2006 | Ishihara | 136/244 |

FOREIGN PATENT DOCUMENTS

| | | |
|---|---|---|
| DE | 3324232 A1 | 1/1985 |
| EP | 1 005 095 A1 | 5/2000 |
| WO | WO 02/13279 A2 | 2/2002 |
| WO | WO 2004/086516 A1 | 10/2004 |
| WO | WO 2005/053037 A1 | 6/2005 |
| WO | WO 2005/076370 A2 | 8/2005 |

OTHER PUBLICATIONS

Jansen, H., et al., "The Black Silicon Method: A Universal Method for Determining the Parameter Setting of a Fluorine-Based Reactive Ion Etcher in Deep Silicon Trench Etching with Profile Control", Journal of Micromechanics and Mircroengineering, 1995, 6 pages, vol. 5.

Ruby, D. S., et al., "Rie-Texturing of Multicrystalline Silicon Solar Cells", Solar Energy Materials & Solar Cells, 2002, pp. 133-137, Elsevier.

Stubenrauch, M., et al., "Black Silicon-New Functionalities in Microsystems", Journal of Micromechanics and Mircroengineering, 2006, pp. S82-S87, vol. 16, Institute of Physics Publishing.

* cited by examiner

*Primary Examiner* — Kimberly Nguyen
*Assistant Examiner* — Mohammad T Karimy
(74) *Attorney, Agent, or Firm* — Slater & Matsil, L.L.P.

(57) ABSTRACT

A semiconductor component that includes a photosensitive doped semiconductor layer, in which electrical charge carriers are released during absorption of electromagnetic radiation is disclosed. The photosensitive semiconductor layer has a structured interface and at least one layer which generates an electric field for separating the released charge carriers disposed downstream of the structured interface. The electric field extends over the structured interface. The photosensitive semiconductor component is distinguished by a high efficiency of the charge carrier separation, in particular, for generating an electric current.

16 Claims, 2 Drawing Sheets

PHOTOSENSITIVE SEMICONDUCTOR COMPONENT

This application is a continuation of co-pending International Application No. PCT/DE2008/000870, filed May 21, 2008, which designated the United States and was not published in English, and which claims priority to German Application No. 10 2007 024 478.0 filed May 25, 2007, both of which applications are incorporated herein by reference.

TECHNICAL FIELD

The invention relates to a photosensitive semiconductor component.

BACKGROUND

A photosensitive semiconductor component in the form of a solar cell is known from the U.S. Pat. No. 4,177,093, for example. The solar cell described therein includes a doped semiconductor substrate, a layer of indium tin oxide (ITO) applied thereto, and also electrical contacts applied on the rear side of the substrate and on the surface of the ITO layer. The ITO layer interacts with the substrate in such a way that, in a manner similar to that in the case of a pn junction, the electrical charge carriers released in the substrate by absorption of electromagnetic radiation are separated for generating an electric current.

A further solar cell is known from the U.S. Pat. No. 5,949,123. This solar cell is based on a p-doped silicon substrate, into which is implanted an n-type dopant for producing a buried pn junction. In order to reduce the reflection at the surface of the silicon substrate, the surface of the silicon substrate is structured. What is achieved in this way is that a higher proportion of light can penetrate into the silicon substrate.

The document WO 02/13279 A2, also published as U.S. Pat. No. 6,329,296, describes structuring the surface of a solar cell by means of an etching method in order to reduce the reflection at the surface.

The document M. Stubenrauch, et al., "Black Silicon— New Functionalities in Microsystems", J. Micromech. Microeng. 16 (2006), pp. 82-86, discloses a plasma etching method for producing needle-like structures in silicon layers. Furthermore, the document H. Jansen, et al., "The black silicon method: a universal method for determining the parameter setting of a fluorine-based reactive ion etcher in deep silicon trench etching with profile control" J. Micromech. Microeng. 5 (1995), pp. 115-120, also describes a method for producing needle-like structures in silicon.

SUMMARY

In one aspect, the invention provides an improved photosensitive semiconductor component which is distinguished, in particular embodiments, by a more efficient charge carrier separation of the charge carriers produced in a photosensitive semiconductor material.

In the case of a semiconductor component according to an embodiment of the invention including a photosensitive doped semiconductor layer, in which electrical charge carriers are released during absorption of electromagnetic radiation, the photosensitive semiconductor layer has a structured interface. At least one layer which generates an electric field for separating the released charge carriers is disposed downstream of the structured interface, wherein the electric field extends over the structured interface.

The layer disposed downstream of the photosensitive semiconductor layer can be applied directly to the structured interface or be spaced apart from the photosensitive semiconductor layer by one or more interlayers. What is achieved by the fact that the layer suitable for generating an electric field is disposed downstream of the photosensitive semiconductor layer is that the electric field extends over the structured interface of the photosensitive layer. Consequently, the active region in which charge carrier separation takes place, on account of the structuring of the photosensitive layer, is significantly larger than in conventional components, where the active region is formed, for example, from a planar interface between a silicon substrate and an ITO layer or from a pn junction formed within the substrate. Therefore, the structuring of the photosensitive layer not only reduces the reflection at the interface, but also enlarges the active region in which charge carrier separation takes place.

The layer disposed downstream of the substrate contains, in particular, a transparent electrically conductive material. Preferably, the transparent electrically conductive material is a transparent conductive oxide, in particular, indium tin oxide (ITO), indium zinc oxide (IZO), zinc oxide (ZnO) or cadmium stannate (CTO, $Cd_2SnO_4$).

Furthermore, the transparent electrically conductive material can also be a transparent conductive polymer.

In a further embodiment, the layer disposed downstream of the photosensitive semiconductor layer is a semiconductor layer that differs from the photosensitive semiconductor layer in terms of its doping type and/or its dopant concentration.

In particular, the layer disposed downstream of the doped photosensitive semiconductor layer can have the opposite doping type, such that, by way of example, the photosensitive semiconductor layer is p-doped and the layer disposed downstream is n-doped, or vice versa. In this way, a pn junction is formed at the interface of the structured photosensitive semiconductor layer, wherein the pn junction, on account of the structuring, is advantageously larger than in the case of a planar interface between the semiconductor layers of opposite doping types.

At least one interlayer can be arranged between the photosensitive layer and the layer disposed downstream thereof. In particular, the interlayer can be a silicon oxide layer which, by way of example, can form on the photosensitive semiconductor layer before the transparent conductive layer is applied. Furthermore, the interlayer can also be a layer composed of an intrinsic semiconductor material, particularly if the photosensitive semiconductor layer and the layer disposed downstream are two semiconductor layers having different doping types.

The structured interface of the photosensitive semiconductor layer is preferably structured in such a way that it has structures having a width of less than 100 nm. Preferably, the structured interface has structures having a width of between 10 nm and 100 nm.

On account of the structured interface, a refractive index gradient is formed between the photosensitive layer and the downstream layer, such that the interface between the layers acts as an effective medium.

Furthermore, it is advantageous if the structures produced at the interface of the photosensitive semiconductor layer have a height of more than 100 nm. In particular, the height of the structures produced at the structured interface can be between 1.5 μm and 10 μm.

The structures produced at the interface of the photosensitive semiconductor layer are distinguished by a high aspect ratio, in particular. This has the advantage that the interface is considerably enlarged in comparison with a virtually smooth interface. Preferably, the height of the structures amounts on average to at least 10 times the width, particularly preferably even at least 50 times the width.

In one advantageous configuration, the structured interface of the photosensitive semiconductor layer has structures which predominantly, that is to say to the extent of more than half, have a flank gradient of more than 45°. By way of example, the flanks of the structures can form angles in the range of 80° to 85° with a principal plane of the photosensitive semiconductor layer. In particular, the structures can be needle-shaped structures.

The structured interface can have, in particular, a stochastic structure, that is to say a structure in which the structure heights and structure widths have a statistical distribution, in contrast to deterministic structures produced by lithographic techniques, for example.

Preferably, the structured interface is structured by means of an etching method. For this purpose, a plasma etching method is preferably used, such as an ICP (inductively coupled plasma) etching method, in particular. As an alternative, however, other methods of physical removal such as laser structuring, for example, can also be used.

The application of an etching method for producing a stochastic structure is advantageous in comparison with lithographic structuring methods because the production outlay is comparatively low.

As an alternative, however, it is also possible for the interface of the photosensitive semiconductor layer to have a deterministic, that is to say predetermined, structure, which is produced lithographically, for example, in particular, using an etching mask.

BRIEF DESCRIPTION OF THE DRAWINGS

The invention is explained in more detail below on the basis of exemplary embodiments.

Identical or identically acting elements are provided with the same reference symbols in the figures. The figures should not be regarded as true to scale; rather, individual elements may be illustrated with an exaggerated size for clarification.

DETAILED DESCRIPTION OF ILLUSTRATIVE EMBODIMENTS

Figure 1:
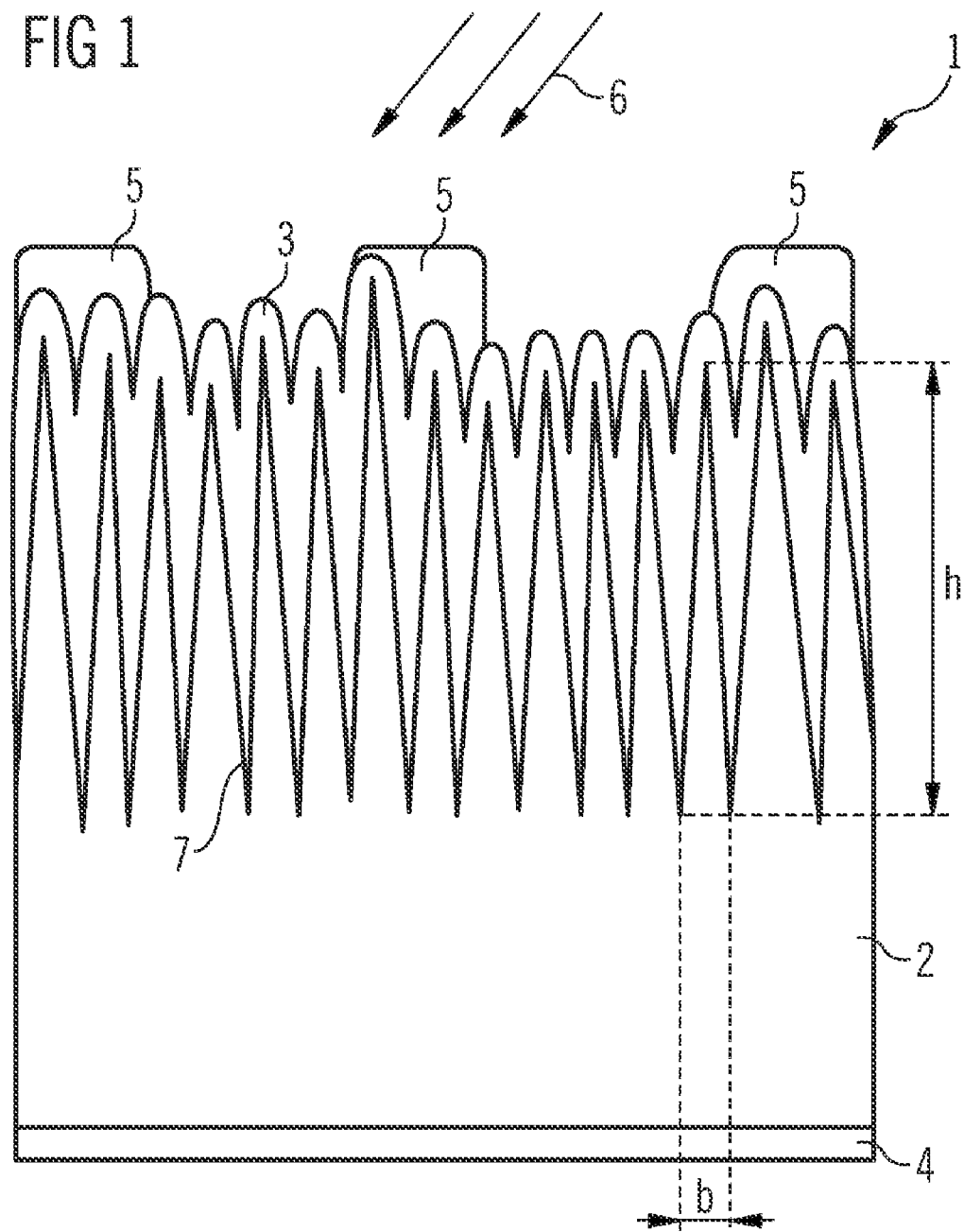
FIG. 1 shows a schematic illustration of a semiconductor component in accordance with a first exemplary embodiment of the invention.

The semiconductor component 1 in accordance with a first exemplary embodiment of the invention as illustrated in FIG. 1 is a solar cell containing a photosensitive semiconductor layer 2, for example, a p-doped silicon layer. The semiconductor layer 2 can be a silicon wafer, for example, which typically has a thickness of more than 100 µm. As an alternative, however, the semiconductor layer 2 can also be a semiconductor layer applied to a substrate, for example, a semiconductor layer applied to a metallic reflector (not illustrated).

In the photosensitive semiconductor layer 2, electrical charge carriers are released upon impingement of electromagnetic radiation, which is indicated by the arrows 6. In particular, the semiconductor component 1 can be a solar cell wherein electron-hole pairs are produced as free charge carriers as a result of the absorption of sunlight in the photosensitive semiconductor layer 2.

A layer 3 used to generate an electric field for separating the released charge carriers is applied to the photosensitive semiconductor layer 2. In this way, in particular, an electric current can be generated from the released charge carriers. In order to lead away the electric current from the semiconductor component 1, a first electrical contact 4 can be arranged at a rear side of the semiconductor layer 2, the rear side being remote from the layer 3, and further electrical contacts 5 can be arranged on the layer 3. The second electrical contacts 5 can be led, for example, in strip-type fashion over the interface of the layer 3.

The photosensitive semiconductor layer 2 has a structured interface 7. The structured interface 7 can be produced by means of a plasma etching method, for example, in particular, by means of inductively coupled plasma (ICP) etching. In this case, by way of example, $SF_6$ and $O_2$ are used as etching gases. In this case, the form of the structures produced can be set in a targeted manner by the choice of the etching parameters, in particular, the composition of the etching gases. Suitable plasma etching methods, in particular, for producing needle-shaped structures, are known per se from the documents cited in the introduction and will therefore not be explained in any greater detail.

Preferably, structures having a high aspect ratio are produced at the interface 7 by means of the etching method. The interface structures preferably have a height h that is greater than their width b. Preferably, the height of the structures h amounts on average to at least 10 times the width b, particularly preferably even at least 50 times the width b. In particular, the structures are advantageously distinguished by a high flank gradient. Preferably, the structures predominantly, that is to say to the extent of at least half, have a flank gradient of more than 45°.

The width b of the structures is preferably less than 100 nm, in particular, between 10 nm and 100 nm inclusive. The height h of the structures of the interface 7 is preferably between 1.5 µm and 5 µm inclusive.

Figure 2:
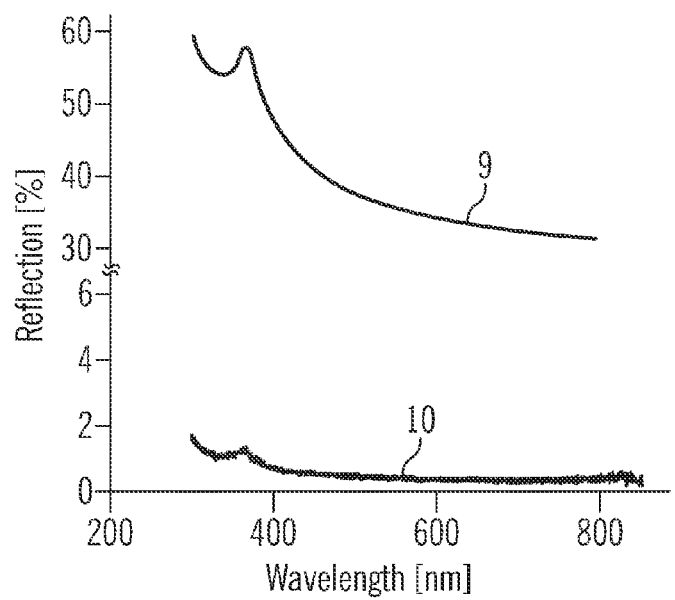
FIG. 2 shows a graphical illustration of the reflection at a structured silicon layer in comparison with an unstructured silicon layer.

The structuring of the interface 7 of the semiconductor layer 2 has a positive effect on the efficiency of the semiconductor component 1 in two respects. Firstly, the reflection at the interface of the semiconductor layer 2 is reduced by the structuring. On account of the structuring of the photosensitive semiconductor layer 2, the reflection at the surface of the semiconductor component 1 is also reduced if the at least one layer 3 downstream of the semiconductor layer 2 is so thin that its surface also has the structuring. The reduction of the reflection at the interface 7 of the semiconductor layer 2 is clarified in FIG. 2, which illustrates the reflection at a silicon layer before and after the structuring as a function of the wavelength. The curve 9 illustrates the reflection at the silicon layer before the structuring, and the curve 10 illustrates the reflection at the silicon layer after the structuring. Since the structured layer exhibits significantly less reflection than an unstructured layer, a larger proportion of the impinging radiation can penetrate into the photosensitive layer, whereby the efficiency of the photosensitive semiconductor component is improved.

A further advantage of the structuring of the semiconductor layer 2 results from the fact that the layer 3 used to generate an electric field for separating the charge carriers released in the photosensitive semiconductor layer 2 is disposed downstream of the semiconductor layer 2, that is to say, is arranged on or above the photosensitive semiconductor layer 2. What is achieved in this way is that the electric field by which the released charge carriers are separated extends over the structured interface 7 of the semiconductor layer 2. The region in which the charge carrier separation takes place is therefore larger than in the case of an unstructured interface between a semiconductor layer 2 and the layer 3 disposed downstream thereof. By way of example, the interface 7 of the photosensitive semiconductor layer 2 can be enlarged by a factor of 10 or more by means of the structuring.

The layer 3 disposed downstream of the structured semiconductor layer 2 preferably contains a transparent electrically conductive material, in particular, a transparent conductive oxide or a transparent conductive polymer. The layer 3 can have a thickness of approximately 1 μm, for example.

Suitable transparent conductive oxides are, in particular, indium tin oxide (ITO) and indium zinc oxide (IZO). Zinc oxide (ZnO), which can be doped with Al, in particular, or cadmium stannate ($Cd_2SnO_4$) are furthermore suitable.

As an alternative, it is also possible for the layer 3 to have a semiconductor material having an opposite doping type with respect to the semiconductor layer 2. By way of example, the semiconductor layer 2 can be p-doped and the layer 3 can be n-doped. In this case, a pn junction is formed between the semiconductor layer 2 and the layer 3, which pn junction extends over the structured interface 7 of the semiconductor layer 2. On account of the structuring, the region of the pn junction is advantageously significantly larger than in the case of a planar interface between a p-doped semiconductor layer and an n-doped semiconductor layer. The layers 2, 3 can be silicon layers having different dopings, by way of example. As an alternative, however, it is also possible to use other semiconductor materials, for example, III-V semiconductor materials such as, in particular, GaAs or InAs.

Figure 3:
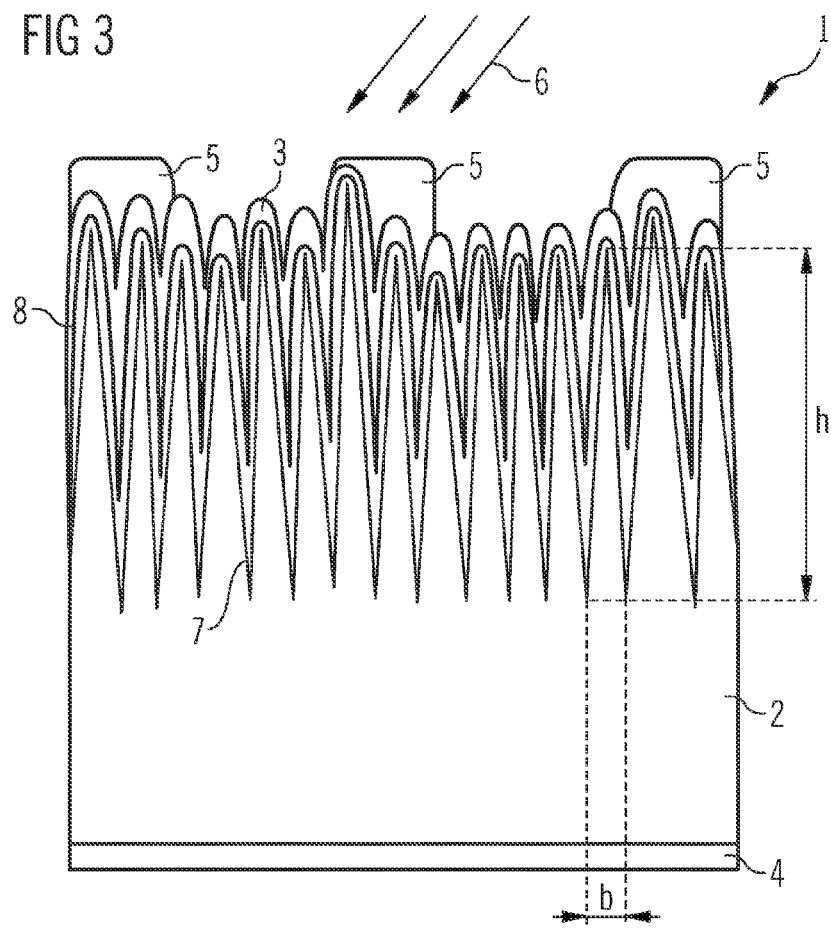
FIG. 3 shows a schematic illustration of a semiconductor component in accordance with a second exemplary embodiment of the invention.

The exemplary embodiment of a semiconductor component as illustrated in FIG. 3 differs from that illustrated in FIG. 1 in that an interlayer 8 is arranged between the photosensitive semiconductor layer 2 and the layer 3 that is disposed downstream thereof and used to generate the electric field for charge carrier separation. In particular, the photosensitive semiconductor layer 2 can be a silicon layer and the interlayer 8 can be a silicon oxide layer. The silicon oxide layer 8 can be, in particular, a native oxide layer that forms on the silicon layer 2 if the semiconductor layer 2 comes into contact with air before the layer 3 is applied.

Furthermore, the interlayer 8 can also be a layer composed of an intrinsic semiconductor material that is inserted between two opposite doped semiconductor layers, for example, in order to reduce the recombination of the charge carriers.

The invention is not restricted by the description on the basis of the exemplary embodiments. Rather, the invention encompasses any novel feature and also any combination of features, which, in particular, comprises any combination of features in the patent claims, even if this feature or this combination itself is not explicitly specified in the patent claims or exemplary embodiments.

What is claimed is:

1. A semiconductor component comprising:
    a photosensitive doped semiconductor layer, wherein electrical charge carriers are released from the photosensitive semiconductor layer during absorption of electromagnetic radiation and wherein
        the photosensitive semiconductor layer has a structured interface,
        the structured interface of the photosensitive semiconductor layer has structures having a width of less than 100 nm and an average height of at least 10 times the width; and
    at least one layer disposed downstream of the structured interface, the at least one layer generating an electric field for separating the released charge carriers, wherein the electric field extends over the structured interface.

2. The semiconductor component as claimed in claim 1, wherein the at least one layer comprises a transparent electrically conductive material.

3. The semiconductor component as claimed in claim 2, wherein the transparent electrically conductive material comprises a transparent conductive oxide.

4. The semiconductor component as claimed in claim 3, wherein the transparent conductive oxide comprises indium tin oxide, indium zinc oxide, zinc oxide or cadmium stannate.

5. The semiconductor component as claimed in claim 2, wherein the transparent electrically conductive material comprises a transparent conductive polymer.

6. The semiconductor component as claimed in claim 2, wherein the at least one layer comprises a semiconductor layer that differs from the photosensitive semiconductor layer in terms of doping type and/or dopant concentration.

7. The semiconductor component as claimed in claim 1, further comprising:
    at least one interlayer arranged between the photosensitive semiconductor layer and the at least one layer.

8. The semiconductor component as claimed in claim 7, wherein the at least one interlayer comprises a silicon oxide or an intrinsic semiconductor material.

9. The semiconductor component as claimed in claim 1, wherein the structures have a height of more than 100 nm.

10. The semiconductor component as claimed in claim 9, wherein the structures have a height of between 1.5 μm and 10 μm.

11. The semiconductor component as claimed in claim 1, wherein the height of the structures is at least 50 times the width.

12. The semiconductor component as claimed in claim 1, wherein the structures have a surface density of at least $10^4$ $cm^{-2}$.

13. The semiconductor component as claimed in claim 1, wherein the structures predominantly have a flank gradient of more than 45°.

14. The semiconductor component as claimed in claim 1, wherein the structured interface of the photosensitive semiconductor layer has a stochastic structure.

15. The semiconductor component as claimed in claim 1, wherein the structured interface of the photosensitive semiconductor layer has a deterministic structure.

16. The semiconductor component as claimed in claim 1, wherein the structured interface of the photosensitive semiconductor layer is structured by means of an etching method.

* * * * *

UNITED STATES PATENT AND TRADEMARK OFFICE
CERTIFICATE OF CORRECTION

PATENT NO.        : 8,217,483 B2  
APPLICATION NO.   : 12/624632  
DATED             : July 10, 2012  
INVENTOR(S)       : Kevin Fuechsel Page 1 of 1

It is certified that error appears in the above-identified patent and that said Letters Patent is hereby corrected as shown below:

On the Title Page, Item (73) Assignee, insert --Friedrich-Schiller-Universität Jena, Fuerstengraben 1, Jena, Germany 07743--.

Signed and Sealed this  
Thirteenth Day of May, 2014

Michelle K. Lee  
*Deputy Director of the United States Patent and Trademark Office*